(12) United States Patent
Yoo

(10) Patent No.: US 6,472,268 B1
(45) Date of Patent: Oct. 29, 2002

(54) METHOD FOR FORMING STORAGE NODE CONTACT

(75) Inventor: Kyong-sik Yoo, Seoul (KR)

(73) Assignee: Hynix Semiconductor, Inc., Gyunggi-Do (KR)

( * ) Notice: Subject to any disclaimer, the term of this patent is extended or adjusted under 35 U.S.C. 154(b) by 0 days.

(21) Appl. No.: 10/004,622

(22) Filed: Nov. 1, 2001

(51) Int. Cl.⁷ .......................................... H01L 21/8242
(52) U.S. Cl. ...................................... 438/253; 438/254
(58) Field of Search ............................. 438/3, 238–240, 438/250–256, 381, 393–399

(56) References Cited

U.S. PATENT DOCUMENTS 5,321,649 A * 6/1994 Lee et al. ...................... 101/35
5,441,908 A * 8/1995 Lee et al. ................... 438/253

* cited by examiner

Primary Examiner—Jey Tsai
(74) Attorney, Agent, or Firm—Marshall, Gerstein & Borun.

(57) ABSTRACT

In a method for forming a storage node contact, the inorganic SOG layer is deposited and heat-treated after forming a bit line having a conductive layer and a spacer on the semiconductor substrate and accordingly, there is an advantage that the density of the organic SOG layer embedded between the bit lines become lower than that of the organic SOG layer stacked on the bit lines. As a result, when performing the wet etching process, the speed for etching the inorganic SOG layer between the bit lines become very rapid, so that an artificial void is formed, an etching become very easier when performing a dry etching process of a deep storage node contact junction part. According to the present invention, the characteristic and yield of the semiconductor device become increased. Also, the present invention is very useful and effective because the high integration of the semiconductor device is possible.

3 Claims, 11 Drawing Sheets

METHOD FOR FORMING STORAGE NODE CONTACT

BACKGROUND OF THE INVENTION

1. Field of the Invention

The present invention relates to a method for forming a storage node contact, and in particular to a method for forming a storage node contact which forms an artificial void between bit lines among the processes for forming a contact of a semiconductor device in a COB(Capacitor Over Bitline) structure of the semiconductor device.

The present invention also relates to a method for forming a storage node contact in which a margin between a word line and a bit line can secure more widely since the size of the mask forming a capacitor is formed smaller than the conventional art.

2. Description of the Background Art

As the degree of integration of semiconductor device becomes higher, a design rule of the device is being contracted and a process margin is being reduced. In the case of DRAM (Dynamic Random Access Memory) especially, as the study of which progresses toward development of products at the Gigabits level, the importance of a design rule or a process margin in the fabricating process is being recognized and eventually, they affect the operational characteristics of the device. Particularly, since a capacitor for use in DRAM is required to secure a cell capacitance larger than a predetermined capacity within a limited area to enable normal input/output of data or to obtain refresh characteristics, a storage node of the capacitor has a complicated three-dimensional structure and its height also increases. Accordingly, the contraction of the design rule and the reduction of the process margin in a capacitor for DRAM are regarded as constraints more serious than they are in any other memory device or element.

In order to overcome the above problems and to secure a sell capacitance of a level higher than a predetermined capacity, capacitors of various structures have been proposed, that are classified largely into three types; trench-type capacitor, stack-type capacitor and combination-type capacitor which properly combines the former two types of capacitors. Among them, capacitor of a stack-type structure is being widely used because of its comparatively fewer difficulties in fabricating process as well as the easiness in geometrically increasing an effective area.

COB (Capacitor Over Bit line) structure, a stack-type capacitor mentioned above, is fabricated in an order which is reverse to that of the conventional structures. Namely, a contact hole, hereinafter referred to as a bit line contact hole, that connects a bit line and a drain of a lower cell is formed first. Thereafter, conductive material is deposited on the entire surface of the substrate, then a bit line is formed by photo etching, and after depositing an interlayer insulating layer thereon, a storage node contact hole is formed, by having the interlayer insulating layer penetrated, to connect a lower conductive layer, i.e., a source of a cell transistor. The COB structure is then completed by finally depositing a conductive layer on the substrate, photo etching, and forming a storage node. The above-mentioned COB structure is cable of excluding a design rule regarding bit line contact hole when forming the capacitor, and thus has greatly contributed to increasing effective area of a storage node.

In a conventional art, a method for forming a contact will be described with reference to the accompanying drawings as follows.

FIGS. 1a to 1c are views illustrating sequentially processes for forming a storage node contact in accordance with the conventional art.

As shown in FIG. 1a, a bit line 112 is formed on a semiconductor substrate 110 having a predetermined lower structure. An upper part and a sidewall of the bit line 112 are covered with a hard mask 114 and a spacer 116, respectively.

As shown in FIG. 1b, a first conductive layer for forming a sacrificed insulation pad 120 is deposited on the entire surface of the resultant material and thereafter photo etched, thereby forming a sacrificed insulation pad 120.

As shown in FIG. 1c, an interlayer insulation layer 130 is deposited on the resultant material and thereafter a planarization process is performed. Continuously, a contact hole 132 is formed on a position of the interlayer insulation layer 130 corresponding to a position existing the sacrifice insulation layer 120 and thereafter a predetermined pattern, for example a conductive layer 140 for forming a storage electrode of a capacitor, is formed on the entire surface of the resultant material.

However, as mentioned above. when a junction part of the storage node is formed by embedding the sacrifice insulation pad 120 to the contact hole 132, an entire step difference is increased, so that the etching of the bit line is not performed in one's own way because of the increase of the entire step difference when performing a dry etching for forming a deep junction part. That is, according to the conventional art, there are several disadvantages that a formation of the storage is very difficult, that is, the fabrication processes are very difficult and the yield is reduced.

Also there are further disadvantages that although a void having reproducibility, not affected by a wiring structure, is formed and a layer having a bad step coverage characteristic is used, the residual layer on the sidewall and the lower portion of the junction part can not be removed completely.

SUMMARY OF THE INVENTION

It is an object of the present invention to provide a method for forming a storage node contact in which the inorganic SOG layer is deposited and heat-treated after forming a bit line having a conductive layer and a spacer on the semiconductor substrate and there is an advantage that the density of the organic SOG layer embedded between the bit lines become lower than that of the organic SOG layer stacked on the bit lines. When performing the wet etching process, the speed for etching the inorganic SOG layer between the bit lines become very rapid, so that an artificial void is formed and an etching become very easier when performing a dry etching process of a deep storage node contact junction part.

In order to achieve the above-described object of one aspect of the present invention, a method for forming a storage node contact comprises the steps of: forming a bit line on a semiconductor substrate having a predetermined lower structure; depositing an inorganic SOG oxide layer on the resultant material and executing a thermal process; depositing a photo resist layer on the inorganic SOG layer and then forming a photo resist pattern in order to intercept a part for forming a storage node contact and open the other part, thereafter etching the inorganic SOG oxide layer; forming an artificial void by removing the inorganic SOG oxide layer filled between the bit lines by a wet etching process; depositing a HDP oxide layer on the- resultant material for isolating the storage node in order not to be embedded the void of the inorganic SOG oxide layer; performing a planarization process of the resultant material by a CMP process and thereafter depositing a photo resist layer selectively and executing a masking etching process for forming a storage node contact, thereby forming the storage node contact connected to a plug poly.

According to the present invention, there is an advantage that the density of the organic SOG layer embedded between the bit lines become lower than that of the organic SOG layer stacked on the bit lines and when performing the wet etching process, the speed for etching the inorganic SOG layer between the bit lines become very rapid, so that an artificial void is formed. As a result, when performing a wet etching process of a deep storage node contact part, the etching can be executed in a short time by using the void, which is formed by an insufficiency oxidation.

BRIEF DESCRIPTION OF THE DRAWINGS

The present invention will become better understood with reference to the accompanying drawings, which are given only by way of illustration and thus are not limitative of the present invention, wherein.

DETAILED DESCRIPTION OF THE PREFERRED EMBODIMENTS

A method for forming a storage node contact in accordance with a preferred embodiment of the present invention will now be described with reference to the accompanying drawings.

Figure 1A:
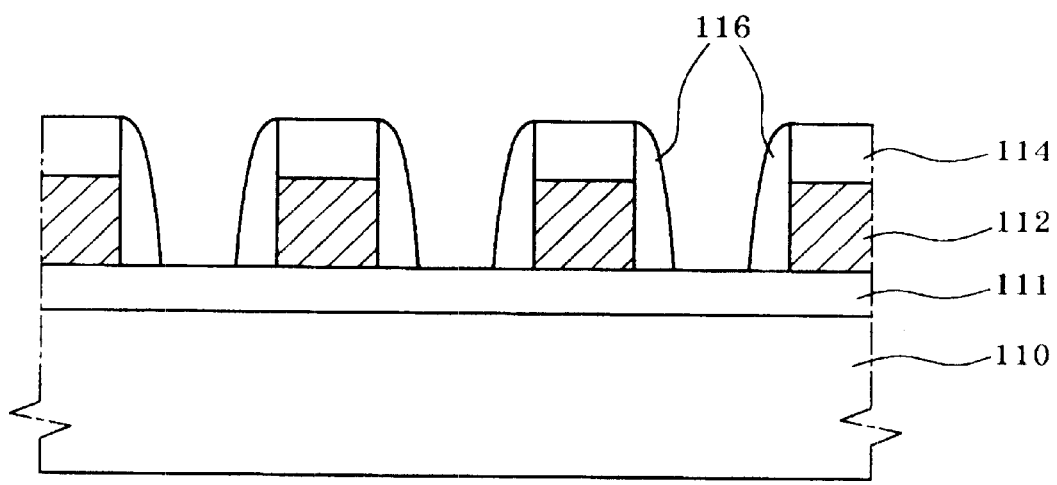
FIGS. 1a to 1c are views illustrating sequentially processes for forming a storage node contact in accordance with the conventional art.
Figure 1B:
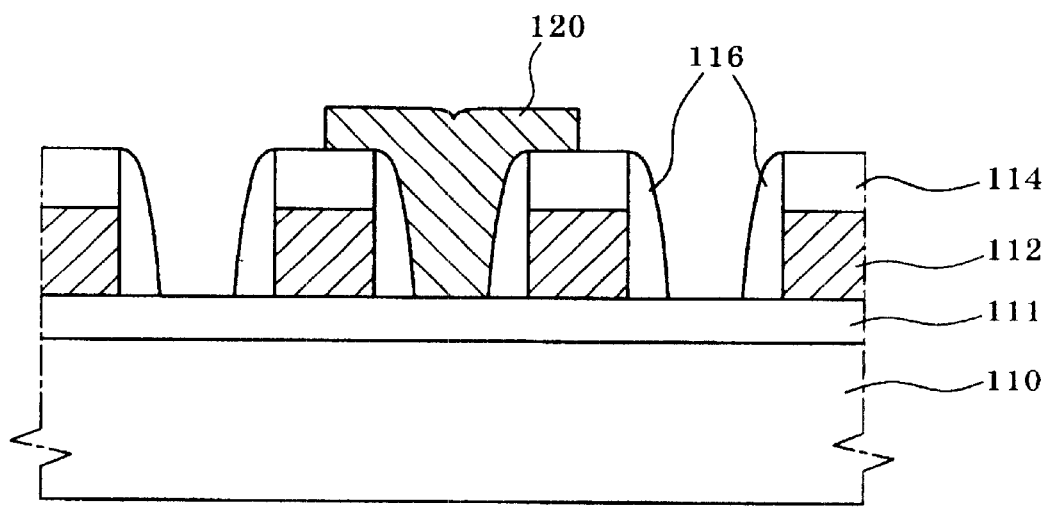
Figure 1C:
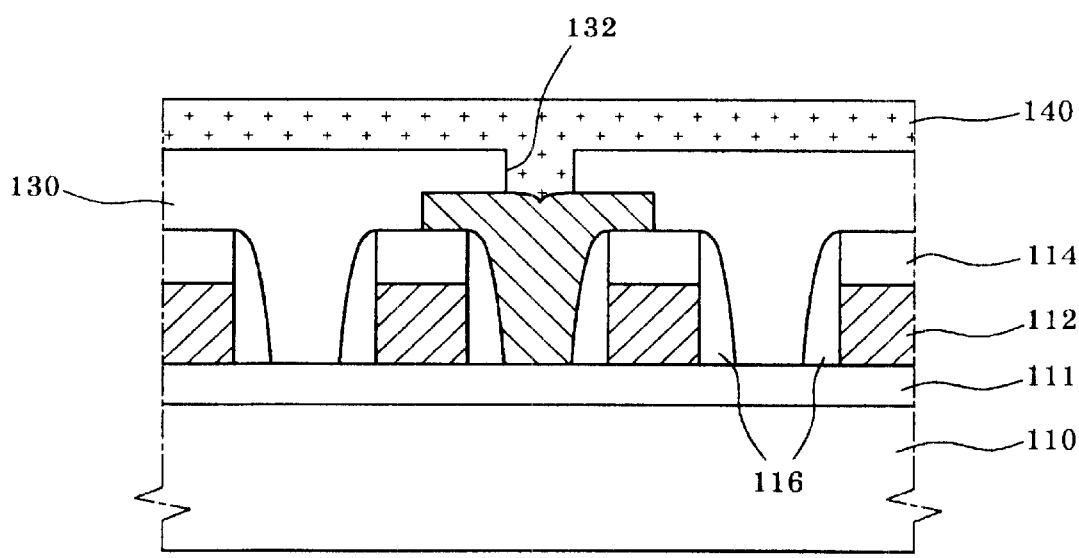
Figure 2A:
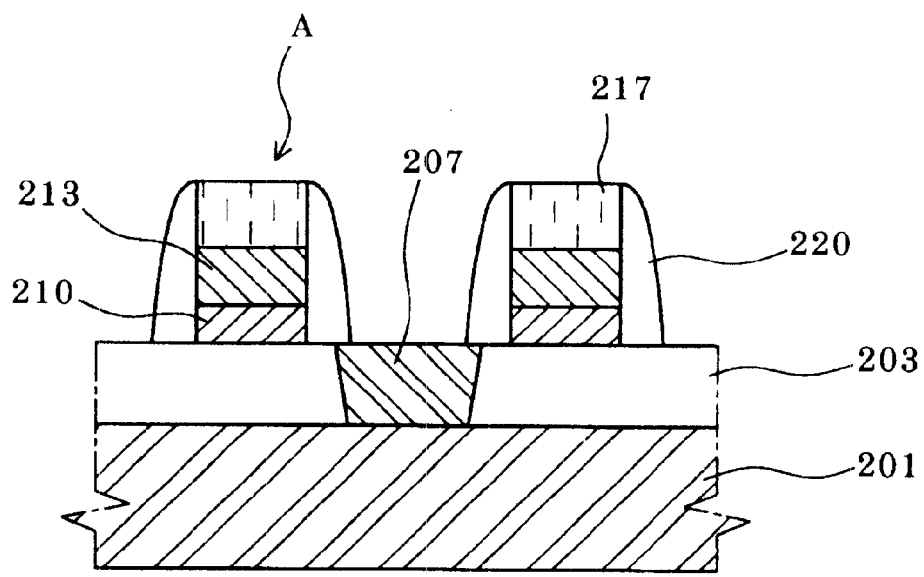
FIGS. 2a to 2f are views illustrating sequentially processes for forming a storage node contact in accordance with the present invention.
Figure 2B:
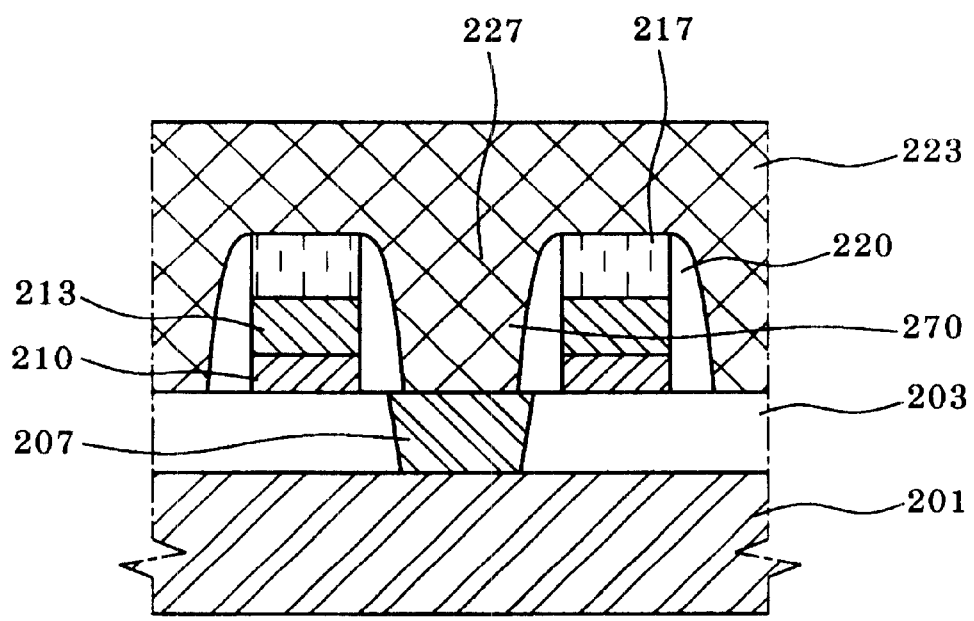

FIGS. 2a and 2b are views illustrating sequentially processes for forming a storage node contact in accordance with the present invention.

As shown in FIG. 2a, an interlayer insulation layer 203 is deposited on a semiconductor substrate 201 having a predetermined lower structure. Thereafter, in the insulation layer 203, a position for forming a plug is etched and a polysilicon is embedded to the position, thereby forming a plug poly.

At this time, a gate oxide layer 210, a conductive layer 213 and a hard mask layer 217 are sequentially deposited on the resultant material and a mask pattern is formed by depositing a photo resist layer through an exposure process. Thereafter, a process of a mask etching is executed until the interlayer insulation layer 203 and a spacer 220 is deposited on the sidewall of the mask pattern, thereby forming a bit line A.

Continuously, as shown in FIG. 2b, after forming the bit line A, a HSQ SOG oxide layer 223 is deposited and then a heat treatment process is executed in the state that the lower plug poly 207 is opened.

The deposition process of the inorganic SOG oxide layer 223 is executed above 3000Å~3500Å, and the heat treatment process is executed by a nitrogen atmosphere at above 600~650.

At this time, there is an effect that the density of the inorganic SOG layer embedded between the bit lines become lower than that of the inorganic SOG layer stacked on the bit line.

Figure 2C:
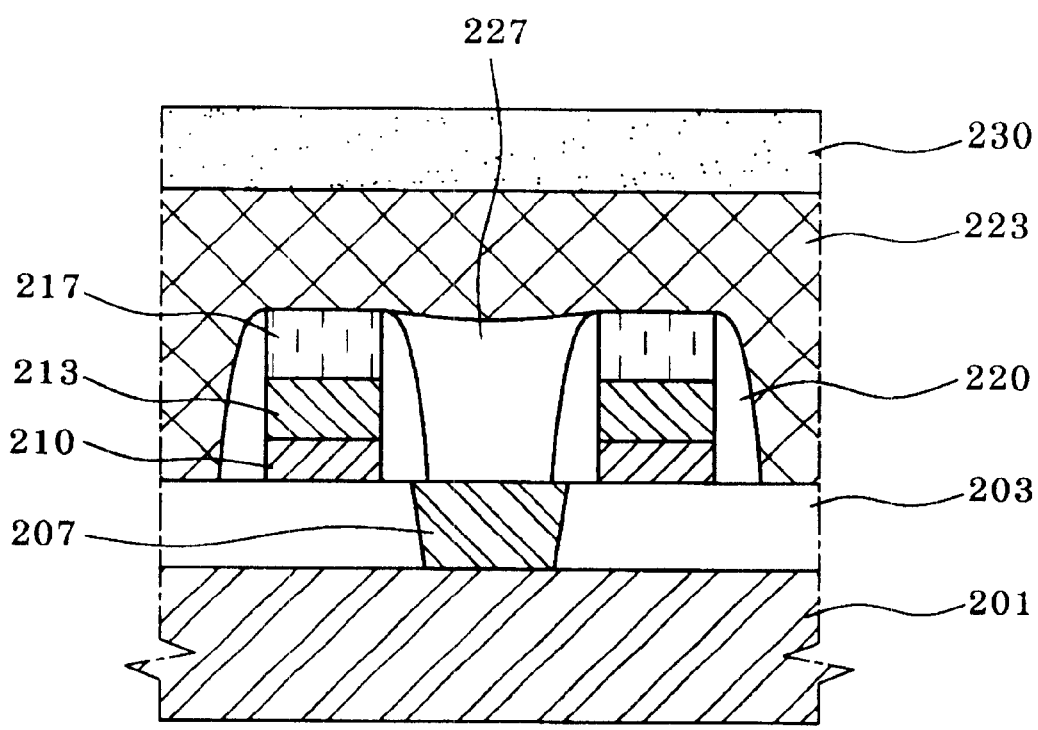

Next, as shown in FIG. 2c, a photo resist layer 230 is deposited on the resultant material and then the inorganic SOG oxide layer 223 is etched, so that a part that will be formed a storage node is intercepted and the other part is opened. Thereafter, the inorganic SOG oxide layer 270 filled to a gap between bit lines through the etched inorganic SOG oxide layer 223 is etched by wet etching process and removed, thereby forming an artificial void 227.

At this time, the wet etching solution used by the wet etching process is HF or BOE solution in order to minimize the thickness in wet etching of the oxidized inorganic SOG oxide layer.

The void 227 is formed by the wet etching process and the width (TOP CD) of the inorganic SOG oxide layer 223 for protecting the storage node does not become smaller by the wet etching process because the. wet etching ratio between the bulk inorganic SOG oxide layer and the filled SOG oxide layer is very high, thereby preventing the void 223 from embedding again when depositing the HDP oxide layer 240 having a superior embedding characteristic.

Figure 2D:
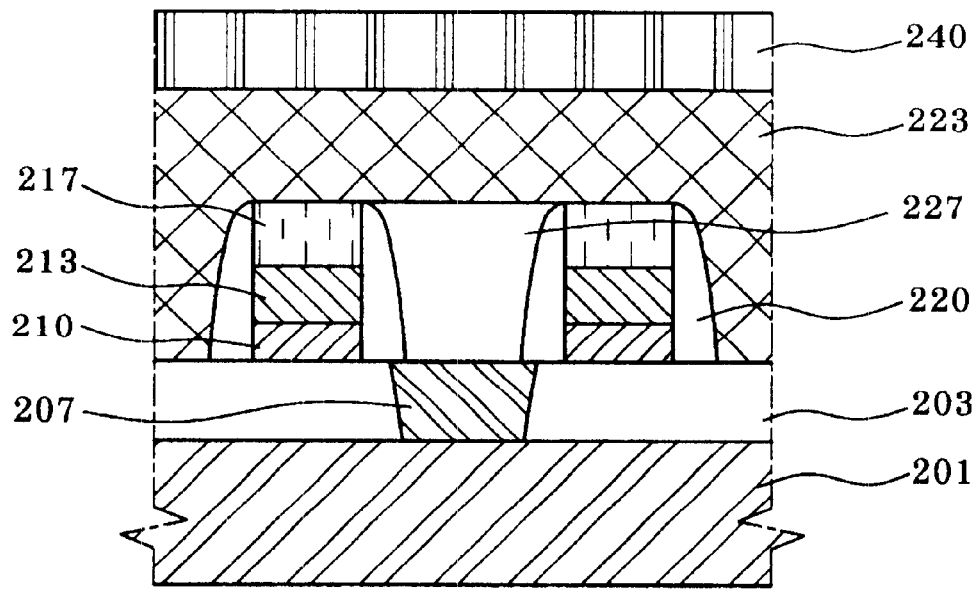

Thereafter, as shown in FIG. 2d, the HDP oxide layer 240 for isolating the storage node is deposited on the resultant material in order not to be embedded the void 227 of the inorganic SOG oxide layer 223 and thereafter is planarized by performing a CMP process.

Figure 2E:
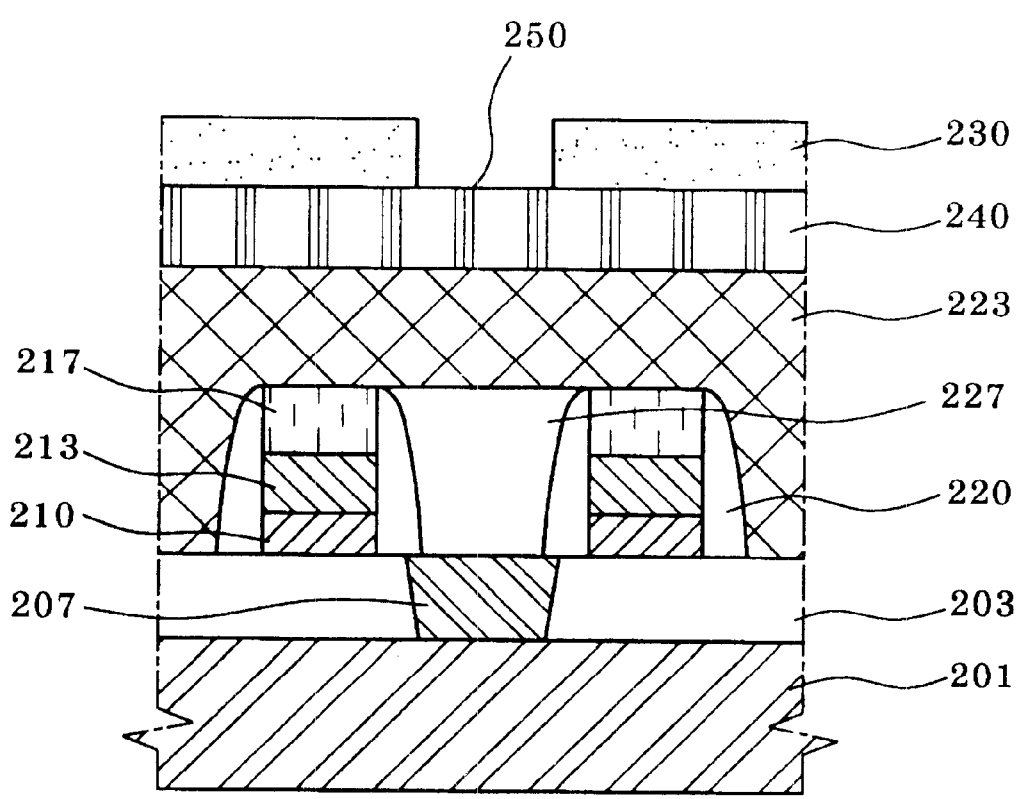

As shown in FIG. 2e, an exposure process is executed in order to can be etched the storage node contact on the resultant material except for the contact forming position 250.

Figure 2F:
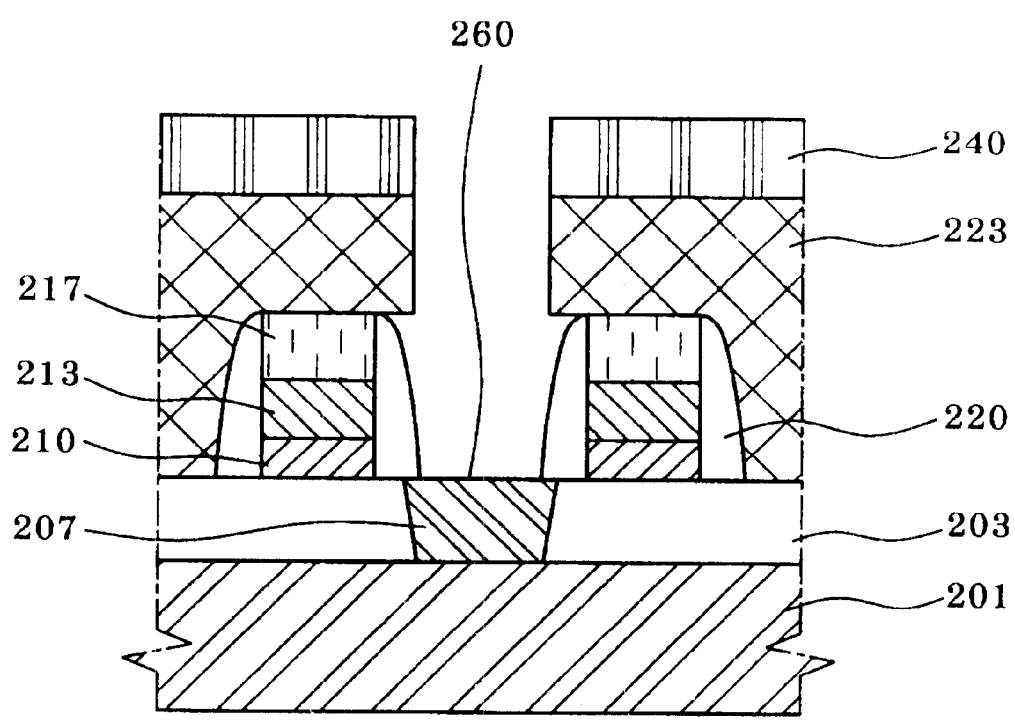

Lastly, as shown in FIG. 2f, the resultant material is dry-etched and thereby a storage node contact 260 is formed.

Thereafter, a semiconductor device is fabricated by using conventional techniques such as processes for forming a charge storage electrode and a metal wire.

Figure 3A:
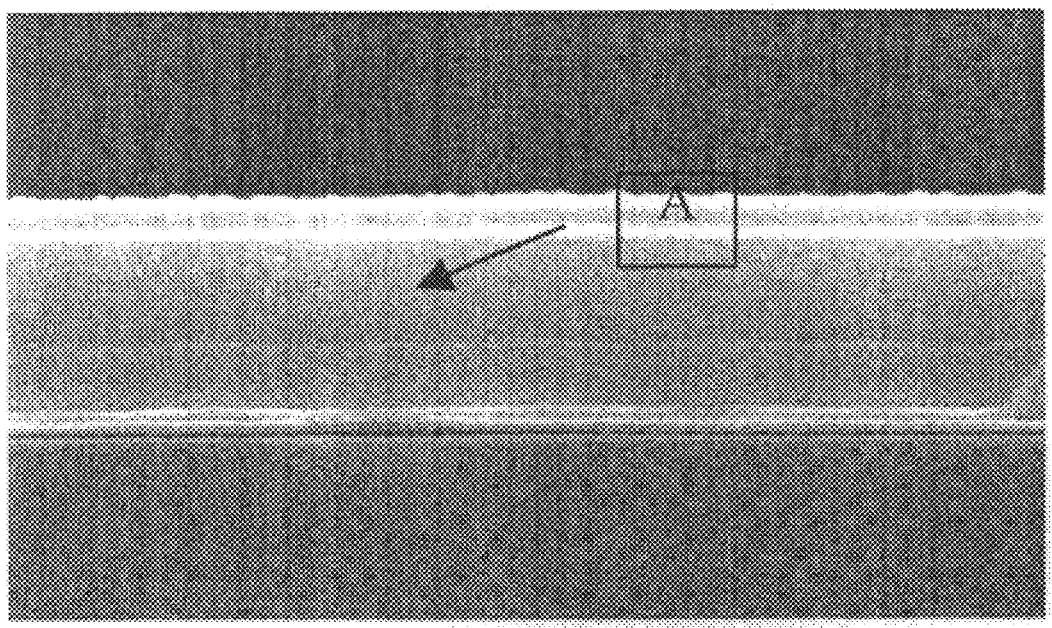
FIGS. 3a and 3b are views illustrating a SOG oxide layer of HSQ heat-treated.
Figure 3B:
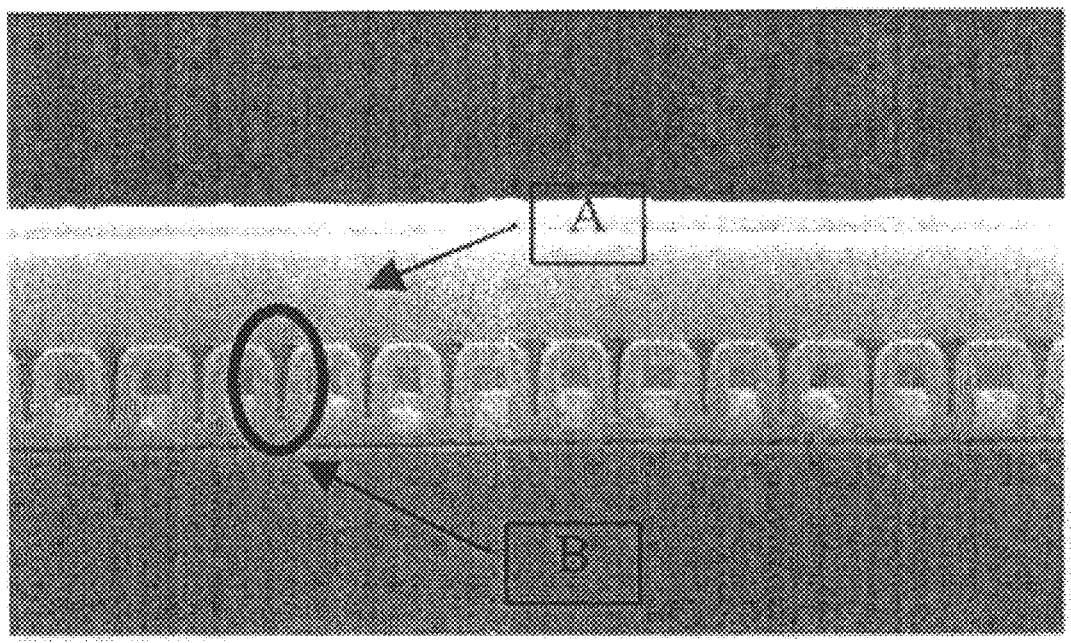

FIGS. 3a and 3b are views illustrating a SOG oxide layer of HSQ heat-treated.

Since the inorganic SOG oxide layer has a superior planarization characteristic, a separate process like a CMP process does not required. As shown in FIG. 3a, there is no a problem when the wiring gap is wide, however, there is a disadvantage that the wiring gap is narrow, as shown in FIG. 3b, the oxide layer does fully oxidized, so that the oxide layer cannot be used directly as an interlayer insulation layer, whereas, the part of B has a characteristic that the wet etching selectivity is very high compared to the part of A.

Accordingly, in the method for forming a junction part of the storage node, the inorganic SOG layer having a superior embedded characteristic is deposited on the junction part of the storage node and heat-treated, and the planarization of the SOG layer is executed, so that the next exposure process become easier.

In addition, there is an advantage that the artificial void formation is maintained constantly always regardless of the change of the bit line. Since the width of the inorganic SOG layer for protecting the storage node is constant regardless of the wet etching process, the disadvantage that the void is embedded again when depositing the HDP oxide layer can be overcome.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for forming a storage node contact comprising the steps of:

forming a bit line on a semiconductor substrate having a predetermined lower structure;

depositing an inorganic SOG oxide layer on the resultant material and executing a thermal process;

depositing a photo resist layer on the inorganic SOG layer and then forming a photo resist pattern in order to intercept a part for forming a storage node contact and open the other part, thereafter etching the inorganic SOG oxide layer;

forming an artificial void by removing the inorganic SOG oxide layer filled between the bit lines by a wet etching process;

depositing a HDP oxide layer on the resultant material for isolating the storage node in order not to be embedded the void of the inorganic SOG oxide layer;

performing a planarization process of the resultant material by a CMP process and thereafter depositing a photo resist layer selectively and executing a masking etching process for forming a storage node contact, thereby forming the storage node contact connected to a plug poly.

2. The method for forming a storage node contact according to claim 1, wherein the inorganic SOG oxide layer is deposited above 3000~3500 and the heat treatment process is executed by a nitrogen atmosphere at above 600~650.

3. The method for forming a storage node contact according to claim 1, wherein the wet etching solution is used HF or BOE wet etching solution when wet etching for forming the void of the inorganic SOG oxide layer.

* * * * *